United States Patent [19]
Buerk et al.

[11] Patent Number: 4,966,664
[45] Date of Patent: Oct. 30, 1990

[54] METHOD FOR REMOVING PHOTORESIST

[75] Inventors: Hermann Buerk, Egling A D Paar; Thomas Wagner, Augsburg; Michael Steinhauser, Eichenau, all of Fed. Rep. of Germany

[73] Assignee: Siemens Aktiengesellschaft, Berlin and Munich, Fed. Rep. of Germany

[21] Appl. No.: 335,858

[22] Filed: Apr. 10, 1989

[30] Foreign Application Priority Data

Apr. 13, 1988 [DE] Fed. Rep. of Germany ....... 3812315

[51] Int. Cl.$^5$ .............................................. C25F 5/00
[52] U.S. Cl. ................................................... 204/146
[58] Field of Search .................. 204/129.1, 130, 141.5, 204/146

[56] References Cited
FOREIGN PATENT DOCUMENTS 3723402 1/1988 Fed. Rep. of Germany .
51-41032 4/1976 Japan .

OTHER PUBLICATIONS

Clyde F. Coombs, Jr., *Printed Circuits Handbook*, Second Edition, McGraw-Hill Book Company, 1979, pp. 8-9-8-11.

*Primary Examiner*—T. M. Tufariello
*Attorney, Agent, or Firm*—Hill, Van Santen, Steadman & Simpson

[57] ABSTRACT

A method for removing photoresists, particularly those stressed during etching is provided. Pursuant to the method, an electrolysis is performed in order to promote basic decoating bath, wherein the substrate carrying the stressed photoresist structure is wired as a cathode. Gases arising directly at the substrate surface or, respectively, at the exposed metallic surfaces, effect a complete decoating the photoresist structure that at the same time is dissolving in the basic bath.

11 Claims, 1 Drawing Sheet

METHOD FOR REMOVING PHOTORESIST

BACKGROUND OF THE INVENTION

The present invention is directed to a method for removing a photoresist. More specifically, the present invention is directed to a method of removing a photoresist that has been stressed by plasma containing fluorine and that lies over metallically conductive layers.

Photoresists are utilized for generating structures, particularly interconnect structures in microelectronics. To this end, photoresists are light-sensitive compounds which upon irradiation by a suitable light, or other radiation source, change their chemical structure. These photoresists therefore exhibit a modified solubility behavior in comparison to nonirradiated lacquer areas. By utilizing a suitable developing process, the structures of the lacquer layer that are latently present after irradiation through a mask, can be three-dimensionally fashioned in that the more easily soluble portions of the photoresist layer that, dependent upon the photoresist, can be the exposed or unexposed parts, are dissolved away.

Photoresist structures generated in this manner can function as a mask during further structuring steps of the layers lying therebelow. For example, an etching process can be performed wherein the portions of the layer lying therebelow, that are not covered by the photoresist, are selectively etched.

After this further structuring step, the photoresist layer must again be removed. However, because during the etching process the photoresists are subjected to structural and chemical modifications, the removal of the photoresist layer can present some problems. In this regard, the thermic stressing of the photoresist, the composition of the etching plasma utilized, as well as the ultraviolet hardening of the photoresist, significantly effect the ability to remove the photoresist.

If an etching plasma is utilized that contains fluorine (a process gas, for example, of $CF_4$ or $SF_6$) fluorine radicals and other reactive etching gas fragments (for example, $CF_3$, $SF_4$, $SF_2$, $COF_2$, $SOF_2$, etc.) will cause a partial or perfloridation of the resist surface (in this regard, one also speaks of a teflonization). The metal fluorides formed during the etching process, acting as Friedel-Craft catalysts, can contribute to an additional cross linking of the photoresist structure.

Furthermore, it is possible that additional compounds will form in the photoresist in view of the metal fluorides acting as Lewis acids. This results in the organic photoresist now having an inorganic component and creating a photoresist that cannot be removed in oxygen plasma without leaving residue. In extreme cases, the modifications to the photoresists can effect the complete resistance of the resist structure, after etching, to solvents (resist strippers) such as Cellosolve or acetone, that are typically utilized.

A photoresist structure treated with fluorine plasma (for example, a situation wherein $SF_6$ is utilized as the etching gas) will exhibit these properties only at the surface that is exposed to the plasma attack. Accordingly, the inside structure of the photoresist remains easily soluble.

In removing the resists, a large portion of the resist is removed by driving in a solvent or by ripping the outside layer open. The selective stripping of the "inner" resist layers, however, leads to the creation of resist skins that initially only adhere at the edges of the structure. But, after the soluble inside layers of the resist are extracted, the remaining resist skins sink down to the base and, particularly after an evaporation of this surface, the resist skins begin to adhere surface-wide to the base. After this has occurred, the resist skins, or residues, can no longer be removed in a wet-chemical manner utilizing am organic solvent, due to the great adhesion the resist skin exhibits and because of the insolubility of the resist skin.

The above problems are particularly prevelant in large-area resist structures (for example, terminal lugs of interconnect structures) or with especially fine structures having an unfavorable ratio of adhesion points to the remaining resist surface. Whereas, in large-area resist structures, the partially stripped resist skin collapses in an uncontrollable fashion over the etched structure and thus contaminates the wafer surface, especially thick skins have been observed in the case of fine structures.

For these reasons, the conventional removal, after a plasma etching step, of the photoresist is of special importance. After acetone removal (even after a preceding pre-treatment step with oxygen plasma), the etched metal structure is still covered by a solid resist coating at many locations. The resist can partially break open at the upper edge of especially fine meandered resist structures. This results in the creation of resist halves that fold into the interspaces not covered by the resist and, for example, an undesired mask during a subsequent ion beam etching.

It is believed that such resist residues that have inorganic components, can only be converted into a purely organic compound by utilizing an additional acid treatment. This purely organic compound or phase then being oxidizable in an oxygen plasma and, thus, being removable.

SUMMARY OF THE INVENTION

The present invention provides a method for removing photoresists. Particularly, the present invention provides a method of removing a photoresist that has been stressed by a plasma containing fluorine, and that lies over metallically conductive layers. To this end, the method comprises the steps of: connecting a substrate that contains the photoresist layer or, respectively, a structure to be decoated, that lies over a metallically conductive layer or, respectively, a structure, to a current source; connecting an inert electrode as a cooperating electrode; implementing an electrolysis in a basic bath, wherein the substrate and the inert electrode function as the electrodes; and terminating the electrolysis, and removing and rinsing the substrate with fully desalinated water.

In an embodiment of the method, an aqueous alkali hydroxide solution is used as an electrolyte for the basic bath. Preferably, the concentration of the alkali hydroxide is set to between approximately 1 to about 10 percent by weight.

In an embodiment of the method, an organic base is used as the electrolyte.

In an embodiment of the method, the electrolytic resist decoating is combined with a further decoating method.

In an embodiment of the method, a further electrolysis in an acidic bath is performed either before or after the electrolysis in the basic bath.

In an embodiment of the method, the electrolysis is performed utilizing a constant current source.

In an embodiment of the method, the substrate is wired as a cathode.

An advantage of the method of the present invention is the short time period required for removal of the photoresist. Even after a duration of only one minute of electrolysis, photoresist structures are completely removed. In comparison to conventional methods utilizing an oxygen plasma treatment and a following, wet-chemical removal in acetone or Cellosolve, a time saving of approximately 50% (approximately 25 minutes) is achieved; including the rinsing event with propanol or, respectively, water that follows in both instances.

Additional features and advantages of the present invention are described in, and will be apparent from, the detailed description of the presently preferred embodiments and from the drawings.

DETAILED DESCRIPTION OF THE PRESENTLY PREFERRED EMBODIMENTS

Figure 1:
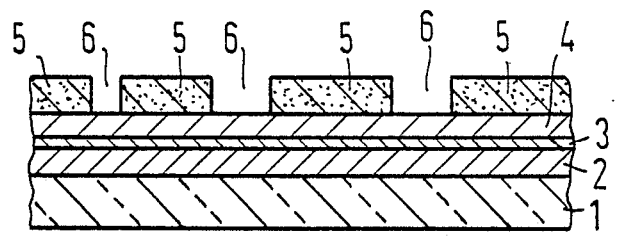
FIG. 1 illustrates a cross-sectional perspective view of a substrate having a photoresist during a step of the method of the present invention.

The present invention provides a simple, fast, and thorough method for removing stressed photoresist layers.

To this end, a method is provided for removing a photoresist that has been stressed by a plasma containing fluorine that lies over a metallically conductive layer comprising the following steps:

(a) connecting a substrate that contains the photoresist layer or, a structure to be removed, lying over a metallically conductive layer or, respectively, a structure, to a current source;

(b) connecting an inert electrode as a cooperating electrode;

(c) implementing an electrolysis in a basic bath, wherein the inert electrode functions as one electrode and the substrate or, respectively, the metallic structure thereof, functions as the other electrode; and (d) terminating the electrolysis, and removing and rinsing the substrate with fully desalinated water.

Utilizing the method of the present invention, even highly plasma-stressed photoresist layers can be completely and rapidly removed. The basic bath functions as a solvent for the more easily soluble, inner lacquer layers. The outer layers of the resist that are difficult to dissolve i.e. the resist skins, are removed mechanically. To this end, the resist skins are removed utilizing gas bubbles (hydrogen or oxygen) that are generated at the surface of the metallic structure by the electrolytic water decomposition. It is also conceivable that the resist removal can be promoted chemically due to the highly reducing or oxidizing effect of the gases that are generated.

Preferably, the substrate, or the metal structure situated thereon, is connected as a cathode during the electrolysis. By doing this, a material erosion at the anode that is triggered by an anodic oxidation (due to a contrary connection) can be prevented.

The electrolyte can comprise, in an embodiment, solutions of potassium hydroxide or, respectively, sodium hydroxide in water. These caustic solutions are capable of incipiently dissolving the photoresist by themselves. In an embodiment, these solutions are utilized in a concentration of approximately 5% by weight. However, the selection of the alkaline or, respectively, the basic electrolyte solutions is not limited to the above substances. In this regard, it should be noted that caustic solutions of hydroxides of other alkaline metals or alkaline earth metals can likewise be utilized.

By utilizing an organic base as an electrolyte other advantages can be achieved by the method of the present invention. Any base that has an adequate solubility with respect to the photoresist and that is stable as an electrolyte can thereby be selected, i.e., bases that are not oxidized or, respectively, reduced, at the anode or, respectively, at the cathode. These organic bases prevent a contamination of the substrates or, respectively, the electrical and electronic component parts that are to be delaminated, with alkali ions. The alkali ions can deteriorate the useful life and functional reliability of the component parts. In this regard, compounds suitable for this purpose comprise a large number of compounds present in the class of amines and amino compounds. These compounds are all distinguished by a high pKa value, which represents a measure for the strength of the base.

The method of the present invention can effect a complete removal of a stressed photoresist by itself. However, the method of the present invention can also be utilized as an adjunct measure in combination with other removal methods already known in the art. Thus, the electrolytic removal can, for instance, be combined with a cleaning process in an oxygen plasma that precedes or, as warranted, follows it. This, therefore, ensures that every photoresist removal problem can be solved by varying the process sequence and by chronologically adapting the process durations to one another.

If a photoresist removal is utilized that is not exclusively electrolytic, i.e., a combination of the method of the present invention with known methods, an acidic electrolyte solution can be utilized. This is important for those applications wherein a base cannot be used.

The present invention shall now be set forth in greater detail with reference to a preferred embodiment and to the figures. Generally, the figures illustrate, from a cross-sectional perspective view, various steps in the method for manufacturing a thin-film magnetic head, including a removal step.

Referring to FIG. 1, a copper layer 2, that is approximately 4 $\mu$m thick, is located on a substrate 1. In the preferred embodiment illustrated, the substrate 1 is a titanium carbide wafer. The copper layer 2 is coated with an approximately 50 nm thick permalloy layer 3 (iron/nickel alloy) to protect it against corrosion (for example, the formation of copper sulfide). A tantalum layer 4, that is approximately 1.7 $\mu$m thick, is located thereover. A photoresist layer 5 (for example, HPR 206) is applied surface-wide, and is structured by irradiation utilizing ultraviolet light through a mask, and is finally developed.

FIG. 1 illustrates the photoresist structure 5 that remains after the development of the irradiated resist layer over the tantalum layer 4, that is undamaged. An etching process follows, during which the resist structures 5 serve as a mask for the structuring of the tantalum layer 4. At the exposed regions 6 thereof, the layer 4 is eroded down to the permalloy layer 3 lying therebelow. To this end, to cause the erosion, a plasma that contains fluorine ions is utilized. For example, an etching gas is used that is composed of $CF_4$ or $SF_6$.

Figure 2:
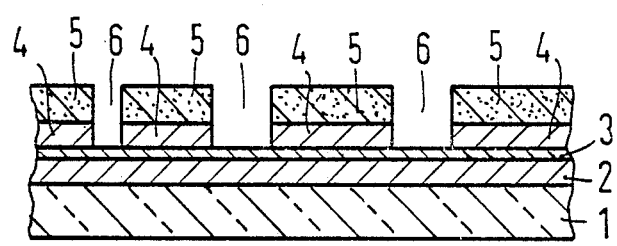
FIG. 2 illustrates a cross-sectional perspective view of the substrate having the photoresist during a further step of the method of the present invention.
Figure 3:
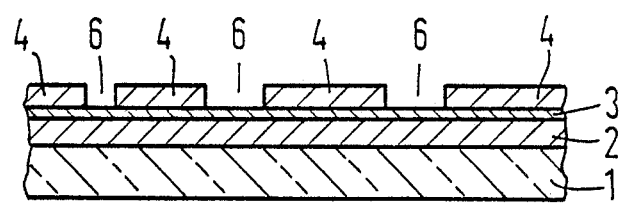
FIG. 3 illustrates a cross-sectional perspective view of the substrate having the photoresist during a further step of the method of the present invention.

Referring now to FIG. 2, the figure illustrates how a tantalum layer 4 is structured in accordance with the photoresist structure 5. The permalloy layer 3 is now exposed at the regions 6.

As a result of this etching process, a chemical reaction with the etching gas components that contain fluorine (for example, $CF_3$, $SF_4$, $SF_2$, $SOF_2$, etc.) modifies the resist structures 5 in terms of their behavior with respect to typical strippers. Accordingly, the photoresist is modified with respect to its reaction to standard resist strippers such as acetone or cellosolve. Therefore, the photoresist 5 cannot be completely removed utilizing either organic solvents or by etching in oxygen plasma.

The wafer is connected, in an electrically conductive manner, to an cathode of a constant current source via its metal layers (2, 3, or 4). An inert electrode, that can be composed of, for example platinum-plated titanium, is wired as an anode and is immersed into a decoating solution composed of a 5% solution of KOH or NaOH. The circuit is closed and the wafer is also immersed into the decoating solution.

The caustic solution functions to dissolve the lacquer layers 5 and expose the regions of the tantalum structure lying therebelow. As with the regions 6 of the permalloy layer 3 that were already exposed, a rapid generation of gas, hydrogen, due to the electrolytic decomposition of the water, occurs in these regions. The gas bubbles are created directly at the metal surfaces and are detached therefrom. These gas bubbles ascend through the solution and thereby mechanically promote a stripping of the resist.

Due to the gas bubbles, the outer resist skins that are insoluble in the caustic solution, are inflated. This prevents the outer resist skins from collapsing and being glued to the support. Pursuant to the method, the resist skins are entirely stripped from the tantalum layer 4. It has been found that by using an electrolysis current density of approximately 20 $A/dm^2$, the photoresist structure 5 is completely removed after approximately 1 minute. The wafer is then removed from the bath, rinsed with completely desalinated water, dried, and can then be processed through the next process step.

The method of the present invention achieves a substantial time-saving when compared to the wet-chemical removal method that previously was utilized. For example, 1 minute of electrolytic decoating has been found to be equivalent to 15 minutes of wet-chemical decoating. The method also eliminates highly plasma-stressed photoresist as well as photoresist having an unfavorable structure, for example having narrow structural widths, sharp turns, and many edges. Furthermore, the method utilizes a non-volatile solvent that is not combustible. Moreover, the method can be utilized in a simple electroplating apparatus and on a large scale.

It should be understood that various changes and modifications to the presently preferred embodiments described herein will be apparent to those skilled in the art. Such changes and modifications can be made without departing from the spirit and scope of the present invention and without diminishing its attendant advantages. It is therefore intended that such changes and modifications be covered by the appended claims.

We claim:

1. A method for removing a photoresist that lies over a metallically conductive layer and that was stressed by a fluorine-containing etching plasma comprising the steps of:
    (a) connecting a substrate containing the photoresist structure that lies over a metallically conductive layer to a current source;
    (b) connecting an inert electrode as a cooperating electrode;
    (c) implementing an electrolysis in a basic bath, wherein the substrate and the inert electrode functions as the electrodes; and
    (d) terminating the electrolysis and removing and rinsing the substrate with fully desalinated water.

2. The method of claim 1 wherein an aqueous alkali hydroxide solution is used as an electrolyte for the basic bath.

3. The method of claim 2 wherein the concentration of the alkali hydroxide is between approximately 1 to about 10 percent by weight.

4. The method of claim 1 wherein an organic base is used as an electrolyte.

5. The method of claim 1 wherein the electrolytic resist decoating is combined with a further decoating method.

6. The method of claim 1 wherein a further electrolysis in an acidic bath is performed before the electrolysis in a basic bath.

7. The method of claim 1 wherein the electrolysis is performed utilizing a constant current source.

8. The method of claim 1 wherein the substrate is wired as a anode.

9. The product of the process of claim 1.

10. The product of the process of claim 2.

11. A method for removing photoresists that have been stressed by a plasma containing fluorine comprising the steps of:
    (a) connecting a wafer having a photoresist layer to a current source via a metal layer of the wafer;
    (b) connecting an inert electrode as a cooperating electrode;
    (c) performing an electrolysis in a basic bath wherein the wafer functions as a cathode and the inert electrode function as an anode; and
    (d) terminating the electrolysis.

* * * * *